US011238767B2

(12) United States Patent
Yuan et al.

(10) Patent No.: US 11,238,767 B2
(45) Date of Patent: Feb. 1, 2022

(54) ARRAY SUBSTRATE, DISPLAY DEVICE AND METHOD FOR DETECTING THE SAME

(71) Applicants: BOE Technology Group Co., Ltd., Beijing (CN); HEFEI XINSHENG OPTOELECTRONICS TECHNOLOGY CO., LTD., Anhui (CN)

(72) Inventors: Can Yuan, Beijing (CN); Zhidong Yuan, Beijing (CN); Yongqian Li, Beijing (CN); Zhenfei Cai, Beijing (CN); Meng Li, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/956,081

(22) Filed: Apr. 18, 2018

(65) Prior Publication Data

US 2019/0066561 A1    Feb. 28, 2019

(30) Foreign Application Priority Data

Aug. 28, 2017    (CN) .......................... 201710751293.0

(51) Int. Cl.
*G09G 3/20*    (2006.01)
*H01L 27/12*   (2006.01)
(Continued)

(52) U.S. Cl.
CPC .............. *G09G 3/20* (2013.01); *G09G 3/006* (2013.01); *G09G 3/3233* (2013.01);
(Continued)

(58) Field of Classification Search
None
See application file for complete search history.

(56) References Cited

U.S. PATENT DOCUMENTS 9,584,799 B2    2/2017  Lee
9,928,801 B2 *  3/2018  You ........................ H01L 27/124
(Continued)

FOREIGN PATENT DOCUMENTS

CN           106652873 A    5/2017

OTHER PUBLICATIONS

First Office Action, including Search Report, for Chinese Patent Application No. 201710751293.0, dated Mar. 13, 2020, 18 pages.
(Continued)

*Primary Examiner* — Benjamin C Lee
*Assistant Examiner* — Emily J Frank
(74) *Attorney, Agent, or Firm* — Judson K. Champlin; Westman, Champlin & Koehler, P.A.

(57) ABSTRACT

Embodiments of the present disclosure provide an array substrate, a display device. The array substrate comprises first power lines and second power lines disposed on a substrate, wherein the first power line crosses the second power line to define a pixel region, wherein the first power lines crosses the second power lines at intersection points, and the intersection points include a first intersection point where the first power line is electrically connected to the second power line and a second intersection point where the first power line is insulated from the second power line are insulated; the first intersection points for each of the first power supply lines and/or the first intersection points for each of the second power supply lines are distributed at intervals.

17 Claims, 9 Drawing Sheets

(51) Int. Cl.
*G09G 3/00* (2006.01)
*G09G 3/3233* (2016.01)

(52) U.S. Cl.
CPC .............. *H01L 27/124* (2013.01); *G09G 2300/0426* (2013.01); *G09G 2300/0452* (2013.01); *G09G 2300/0842* (2013.01)

(56) References Cited

U.S. PATENT DOCUMENTS

| | | | |
|---|---|---|---|
| 2005/0162352 A1 | 7/2005 | Kanda | |
| 2010/0110057 A1* | 5/2010 | Lee | G09G 3/3614 345/211 |
| 2011/0309380 A1* | 12/2011 | Liu | H01L 27/124 257/88 |
| 2012/0062130 A1* | 3/2012 | Ono | G09G 3/3233 315/187 |
| 2012/0249615 A1* | 10/2012 | Lee | H04N 13/341 345/691 |
| 2012/0306939 A1* | 12/2012 | Choi | G09G 3/006 345/690 |
| 2014/0354624 A1* | 12/2014 | Chaji | G06F 1/3265 345/212 |
| 2015/0048835 A1* | 2/2015 | Lee | G01R 31/50 324/414 |
| 2015/0123962 A1* | 5/2015 | Han | G09G 3/3233 345/212 |
| 2017/0053951 A1* | 2/2017 | Sato | H01L 29/78696 |
| 2017/0236887 A1* | 8/2017 | Hashimoto | H05B 33/08 257/40 |

OTHER PUBLICATIONS

Third Office Action, including Search Report, for Chinese Patent Application No. 201710751293.0, dated Dec. 1, 2020, 12 pages.

* cited by examiner

ARRAY SUBSTRATE, DISPLAY DEVICE AND METHOD FOR DETECTING THE SAME

CROSS-REFERENCE TO RELATED APPLICATION

This application claims the priority benefit of Chinese Patent Application No. 201710751293.0 titled "ARRAY SUBSTRATE, DISPLAY DEVICE AND METHOD FOR DETECTING THE SAME" filed on Aug. 28, 2017 in the State Intellectual Property Office of China, the whole disclosure of which is incorporated herein by reference.

TECHNICAL FIELD

The present disclosure relates to display field, and particularly to an array substrate, a display device, and a method of detecting the same.

BACKGROUND

With a rapid development of multimedia technology, Organic Light-Emitting Diodes (OLED) have become an important light emitting element in a display device due to its advantages of self-luminescence, high contrast, wide color gamut, simple fabrication process, low power consumption, and easy realization of flexibility.

SUMMARY OF THE INVENTION

Embodiments of the present disclosure provide an array substrate, a display device and a method of detecting the same, which may solve at least the problem in which the array test (AT) device cannot detect short circuit of a display panel and improve product yield rate.

In order to get the objective as mentioned above, the embodiments of the present disclosure utilize the following technical solutions.

In a first aspect, there is provided an array substrate comprising a plurality of first power lines parallel to one another and a plurality of second power lines parallel to one another, which are both disposed on a substrate, wherein the first power lines cross the second power lines to define a plurality of pixel regions, wherein the first power lines and the second power lines cross one another at a plurality of intersection points, and the plurality of intersection points comprise a first intersection point where one of the first power lines is electrically connected to one of the second power lines and a second intersection point where the first power line is insulated from the second power line; the first intersection points for each of the first power supply lines are distributed at intervals; and/or the first intersection points for each of the second power supply lines are distributed at intervals.

In one embodiment, every M consecutive ones of the first power lines constitute a first power line unit, and every M consecutive ones of the second power lines constitute a second power line unit, and an $i^{th}$ one of the first power lines in each of the first power line units is connected with an $i^{th}$ one of the second power lines in each of the second power line units to form one of the first intersection points; wherein M is an integer greater than 1, i={1, 2, ..., M}.

In one embodiment, the plurality of first power lines are disposed in the same layer and the plurality of second power lines are disposed in the same layer; an interlayer insulating layer is disposed between the first power lines and the second power lines, and the first power lines are connected with the second power lines through via holes at the first intersection points; or an insulating pattern is disposed only at the second intersection points between the first power lines and the second power lines.

In one embodiment, a square resistance of the first power line is greater than that of the second power line.

In one embodiment, the first power lines are disposed on a side of the second power lines close to the substrate.

In one embodiment, the array substrate further comprises a gate line disposed in the same layer as the second power lines.

In one embodiment, the plurality of first power lines are disposed in the same layer, and the second power lines comprise a plurality of line segments disposed in the same layer as the first power lines and not overlapped with the first power lines; at each of the first intersection points, adjacent ends of two adjacent ones of the line segments are connected to the first power line; at the second intersection point, two adjacent ones of the line segments are connected by a bridge, and the bridge is isolated from the first power lines by an insulating pattern.

In one embodiment, a square resistance of the bridge is larger than that of the line segment.

In one embodiment, ends of the line segments are directly connected to the first power lines respectively and the line segments do not run across the first power lines, and the first power lines and the second powers line share structures at positions where the first intersection points are located.

In one embodiment, M≤5.

In one embodiment, M=2 or M=3.

In one embodiment, the first power lines are perpendicular to the second power lines.

The second aspect provides a display device comprising the array substrate according to the first aspect and an anode disposed on the array substrate.

The third aspect provides a method for detecting the display device according to the second aspect, wherein the method comprises steps of: using a detector to detect a potential across the anode of the display device, and determining a region where a failure occurs by judging whether or not the potential across the anode is changed; and determining a position where the failure occurs by an optical detection.

In one embodiment, the step of using a detector to detect a potential across the anode of the display device and determining a region where a failure occurs by judging whether or not the potential across the anode is changed comprises: sensing the potential across the anode by electrodes in the detector; and determining that a failure occurs in a pixel where the anode is located if liquid crystal in the detector is rotated so that the detector emits light.

In one embodiment, the step of determining a position where the failure occurs by an optical detection comprises: capturing a pixel structure of a normal pixel by a microscope as a reference pixel structure; and capturing a pixel structure of a pixel where a failure occurs and comparing it with the reference pixel structure to determine a position where the failure occurs.

DESCRIPTION OF THE DRAWINGS

In order to more clearly describe the technical solutions in the embodiments of the disclosure or in the prior art, the drawings used in the description of the embodiments or the prior art will be briefly described in the following. It is apparent that the drawings in the following description are only certain embodiments of the present disclosure, those skilled in the art may also obtain other drawings based on these drawings without any inventive labors.

DETAILED DESCRIPTION

The technical solutions in the embodiments of the present disclosure will be illustrated clearly and completely in conjunction with the accompanying drawings in the embodiments of the present disclosure. It is apparent that the described embodiments are only some embodiments and not all of the embodiments of the present disclosure. All other embodiments which are obtained by those skilled in the art based on the embodiments of the present disclosure without inventive labors shall fall within the scope of the present disclosure.

Figure 1:
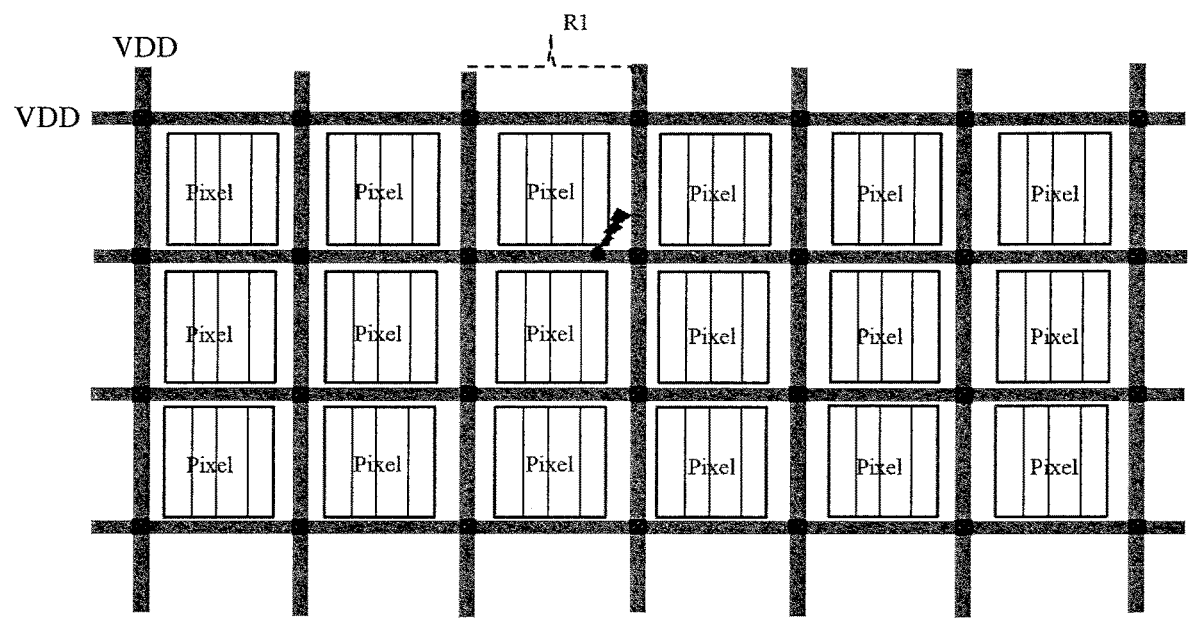
FIG. 1 is a schematic structural diagram of a VDD line provided in the prior art.

In the conventional OLED, a power line (VDD line) functions to provide a voltage signal for the OLED and generate a current for the OLED to emit light. During a process of generating the current, due to its own resistance of the VDD line, there is a certain voltage drop along an extension direction of the VDD line, which tends to cause changes in a drive voltage signal for OLED, thereby affecting uniformity of display effect of the entire display panel. In order to solve the above problem, as shown in FIG. 1, those skilled in the art generally configures the VDD lines in a mesh structure, and solves the problem of non-uniform display effect while reducing the resistance of the VDD line.

Figure 2:
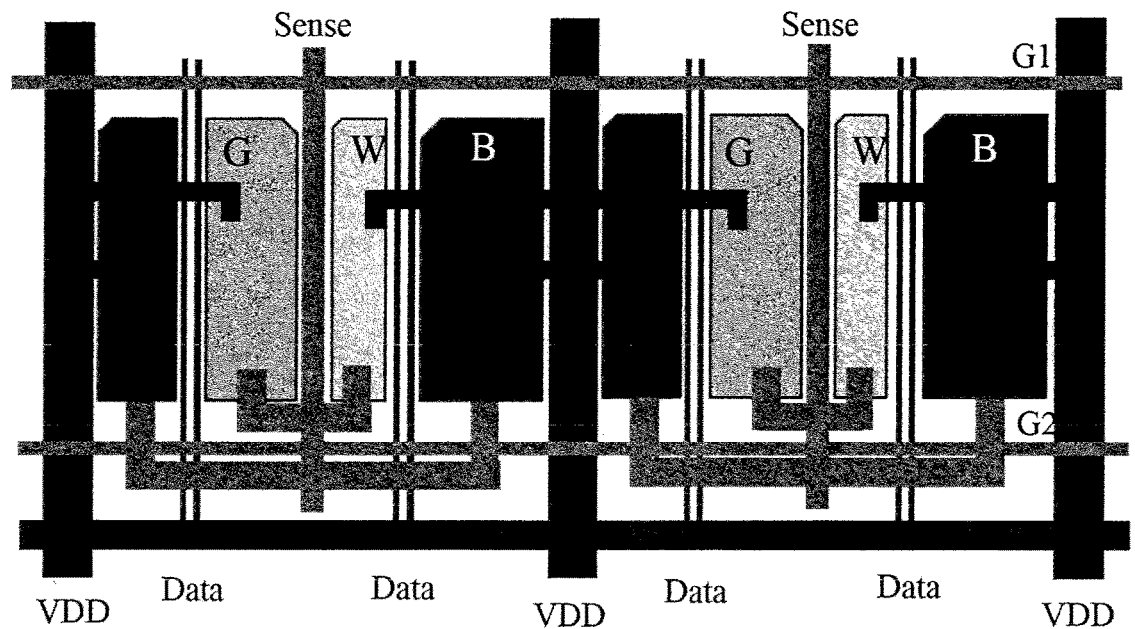
FIG. 2 is a wiring diagram of a signal line on an array substrate provided in the prior art.

However, as shown in FIG. 2, the conventional OLED pixels include a VDD line, a data line Data, a gate signal line GN, and a detection line Sense. As can be seen from FIG. 2, the VDD line crosses other types of signal lines, and there is a high probability of a short circuit between the lines. Since an array test (AT) device may only detect a VDD line where a failure occurs in a vertical or horizontal direction through a corresponding test excitation by a corresponding test pattern, and the VDD line is of the mesh structure, the AT device cannot detect a position where the failure occurs, resulting the panels with such failures cannot be detected, thereby reducing the product yield.

Figure 3:
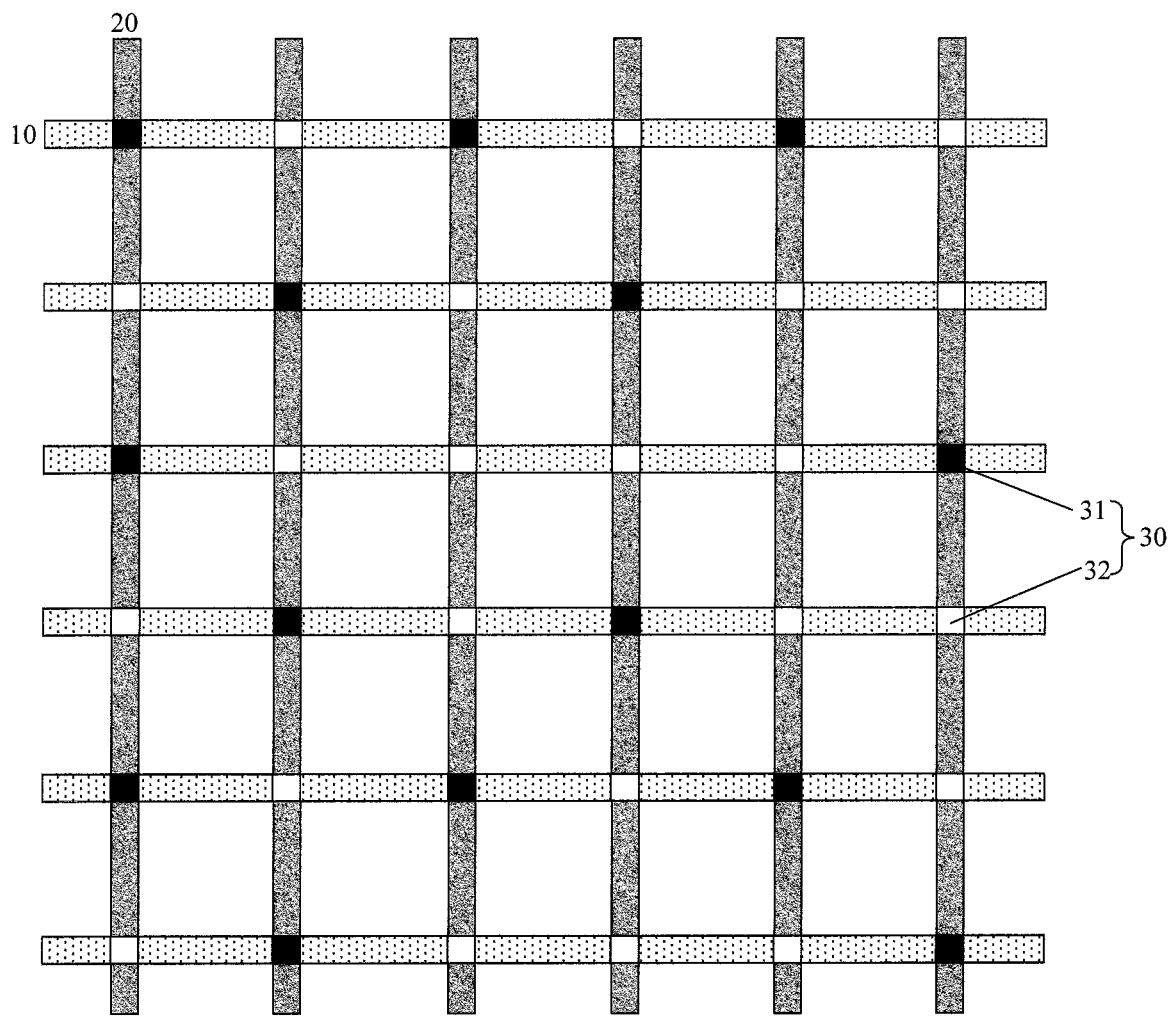
FIG. 3 is a first schematic structural diagram of a VDD line according to an embodiment of the present disclosure.

An embodiment of the present disclosure provides an array substrate. As shown in FIG. 3, the array substrate comprises a plurality of parallel first power lines 10 and a plurality of parallel second power lines 20 which are disposed on a substrate, wherein the first power line 10 intersects with the second power line 20 to constitute a plurality of pixel regions; a plurality of intersection points 30 are obtained by the first power line 10 and the second power line 20, and the intersection points 30 include a first intersection point 31 where the first power line 10 and the second power line 20 are electrically connected and a second intersection point 23 where the first power line and the second power line are insulated from each other; the first intersection points 31 for each of the first power supply lines 10 are distributed at intervals; and the first intersection points 31 for each of the second power supply lines 20 are distributed at intervals.

It should be noted that first of all, the plurality of first power lines 10 are parallel to each other, the plurality of second power lines 20 are parallel to each other too, and the first power line 10 crosses the second power line 20. The intersection point 30 is a section of the first power line 10 and the second power line 20 where the first power line 10 and the second power line 20 spatially cross each other. In one embodiment, the first power line 10 is perpendicular to the second power line 20.

Among others, there is no insulation layer between the first power line 10 and the second power line 20 at the position where the first intersection point 31 connecting the first power line 10 and the second power line 20 is located; and an insulating layer is provided between the first power line 10 and the second power line 20 at the position where the second intersection point 32 isolating the first power line 10 from the second power line 20.

Secondly, the first intersection points 31 for each of the first power line 10 are distributed at intervals. That is to say, as shown in FIG. 3, there is one or more the second intersection point 32 between the two adjacent first intersection points 31 along the direction in which the first power line 10 extends.

The first intersection points 31 for each of the second power line 20 are distributed at intervals. That is to say, as shown in FIG. 3, there is the second intersection point 32 between the two adjacent first intersection points 31 along the direction in which the second power line 20 extends.

The number of the second intersection point 32 between two adjacent first intersection points 31 may be one, two, three or other positive integers, and the arrangement of the first intersection points between the adjacent first power lines 10 or the adjacent second power lines 20 may be the same or different from one another, and may be selected according to the structure of the array substrate.

Among others, the arrangement of the first intersection point 31 may be regular, or may be an arbitrary arrangement manner as shown in FIG. 3, as long as the first intersection point 31 may be distributed at intervals.

Thirdly, the materials for the first power line 10 and the second power line 20 may be the same or different, which is not limited by the embodiments of the present disclosure.

The reason for the low yield of the array substrate provided in the prior art is concluded as follows: as shown in FIG. 1, in the conventional design, the VDD lines are configured in a grid structure, that is, the VDD lines are arranged in the vertical and horizontal respectively to form a network structure, so as to reduce the resistance of the VDD lines and to obtain uniformity of the VDD line potential, so that a uniform display effect may be obtained. However, when the VDD signal lines are not formed in the same layer and a hole is needed to be fabricated to connect the VDD signal lines on different layers through via hole, there is problem that if the VDD line is short-circuited with other lines at other location, it cannot be detected and located by the AT device. At present, the AT device may only detect a VDD line where a failure occurs in a vertical or horizontal direction through a corresponding test excitation by a corresponding test pattern. However, as for the grid structure, it cannot locate a specific position at the VDD line where the failure occurs, i.e. it can't accurately locate a failure point so that the panels having such failures can't be repaired and accordingly yield is lost.

Figure 4:
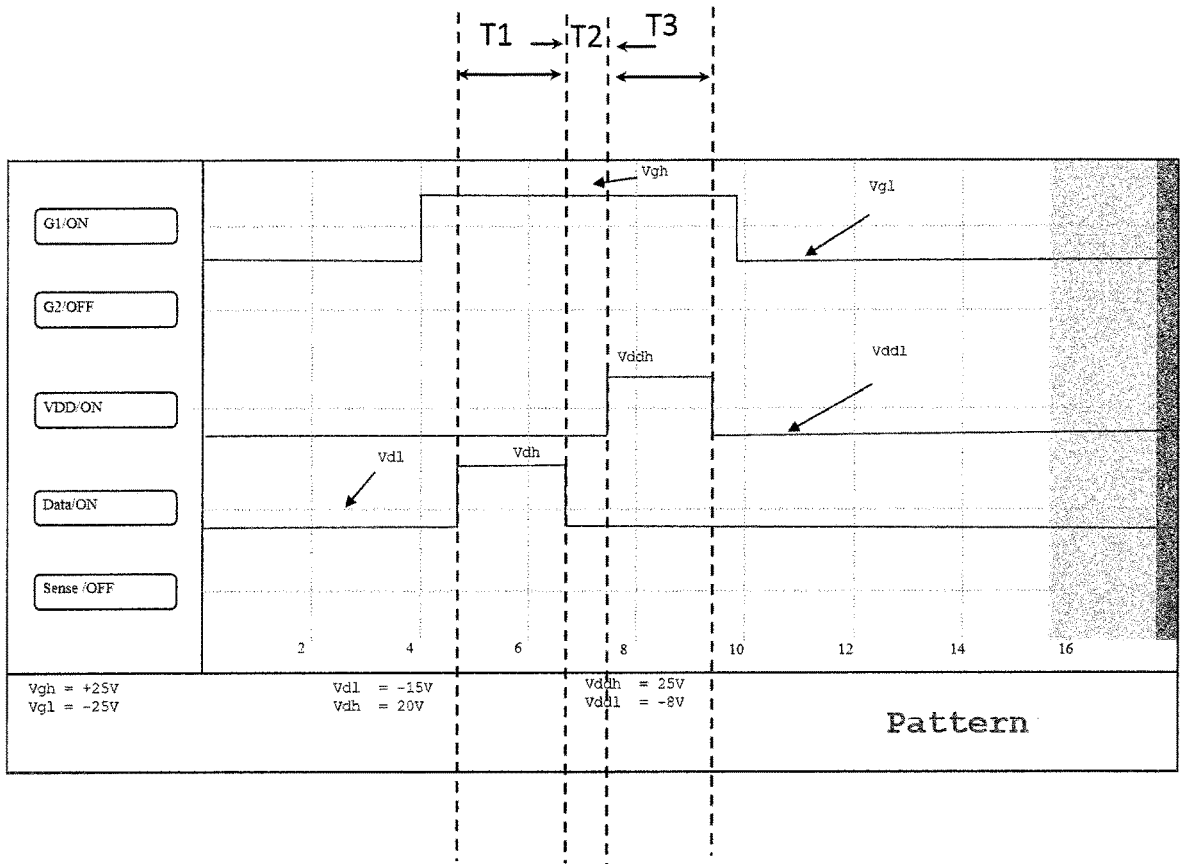
FIG. 4 is a diagram of an AT detection signal provided by an embodiment of the present disclosure; FIG.

The principle for the AT detection is as follows: by taking a data line Data as an example, the short circuit of VDD and Data lines may be detected by the AT detection pattern of FIG. 4. Due to the presence of the VDD line grid structure, the short-circuit potential will cause the potential on the Data line to be affected by VDD line, which leads to that the potential on the Data line where the short-circuit point is located is the same as the potential on the VDD signal line.

Figure 5:
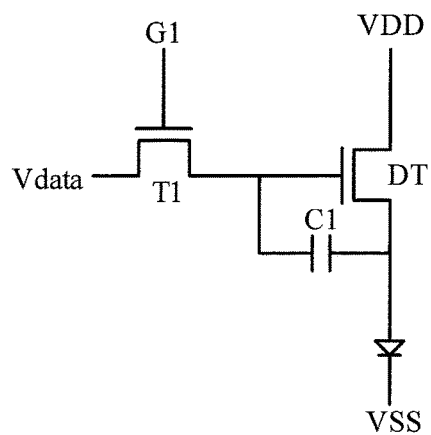
FIG. 5 is a pixel circuit diagram provided by an embodiment of the present disclosure.

The pixel circuit diagram is shown in FIG. 5. The specific steps for detection are as follows: at T1, Vdata is set to be a high level, G1 is turned on, VDD line is at a low level, and the drive TFT is turned on. At this time, the potential on the ITO is a low level.

At T2: Vdata is set to be a low level, G1 is turned on, the VDD line is a low level. At this time, the drive TFT is turned off.

At T3: VDD line is set to be a high level, G1 is turned on. If the lines of VDD and Data lines are shorted, Data is pulled high, the drive TFT is turned on and the potential on the ITO becomes high, so the position of the line where a failure occurs is detected.

Among others, the amount of the potential change on the ITO from a low level to a high level is related to the voltage drop on VDD line. The larger the voltage drop on the VDD line is, the greater the amount of the potential change on the ITO is, and the easier it is to be detected. In the prior art, as the voltage drop on the VDD line is too small, the amount of the potential change on the ITO cannot be detected, resulting in a decrease of the product yield.

Specifically, $$\Delta V = I*R = I*Rs*\frac{L}{W}$$

where if there is a defect on the VDD line and different voltages are applied to the signal line, and a current I flows through the VDD line; L is a distance between the VDD line connections (i.e. a distance between two of the first intersection points 31), W is a line width of the VDD line, and Rs is a square resistance of the VDD line.

The principle for improving the yield of the array substrate according to the present disclosure is shown as follows: in the prior art, by optimizing and dividing the VDD line mesh structure, it can be compared and seen from the VDD line mesh structure in FIG. 1 that the connection structure of VDD lines constitutes a shape of "☐" at the defect position (which is denoted by a black lighting pattern in FIG. 1), and the resistance between the connection lines is $R_1$, $R_1=R_{s1}*L_1/W_1$. It can be seen from the figures that there will be a voltage drop of $$\Delta V1 = I*R_1 = I*Rs_1*\frac{L_1}{W_1}$$

between the VDD lines. Due to the presence of such a mesh structure, for the VDD line at the defect, $L_1$ is small, and its difference of $\Delta V1$ is very small, while the VDD signal is very strong, which leads to that the signal on the VDD line may not be substantially affected by the Defect and that the potential change on the ITO is not obvious so that the AT device can't check out the exact location.

The connection structure of the VDD lines according to the present disclosure is designed such that connection points in the connection structure are in a separated manner for each row and each row. Through the shield metal connection, the resistance between the connection points may be effectively increased, and the resistance thereof is $R_2=R_{s2}*L_2/W_2$, wherein $L_2=N*L_1$, N is a positive integer greater than 1, the potential difference is as follows:

$$\Delta V2 = I*R_2 = I*Rs_2*\frac{L_2}{W_2} = I*Rs_2*\frac{N*L_1}{W_1}.$$

As can be seen from the formula, since L2>>L1, $\Delta V2>>\Delta V1$, and such a design may amplify the difference between the VDD line potential at the Defect and the VDD line potential at the surrounding V, so that the potential difference around the VDD line at the Defect may be revealed and in turn the failure on the VDD signal line may be detected by corresponding excitation. Such kind of structure may improve the detection ratio of failure of the VDD signal, thereby improving the yield ratio.

Figure 6:
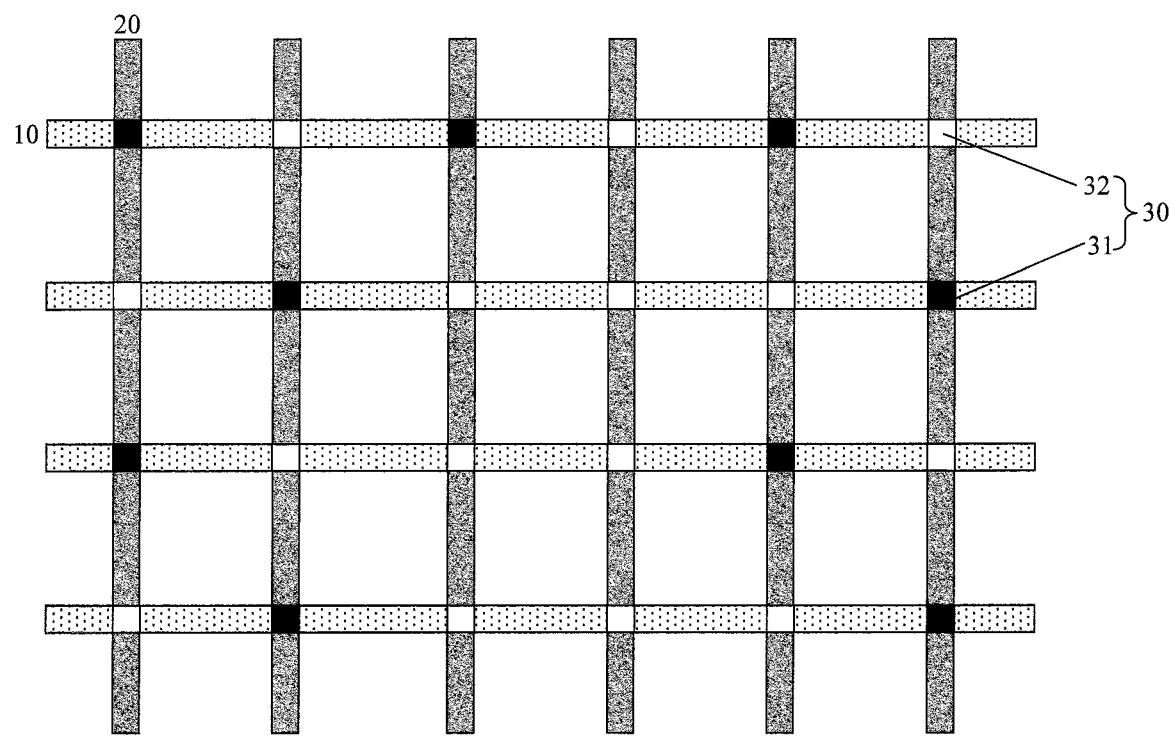
FIG. 6 is a second schematic structural diagram of a VDD line according to an embodiment of the present disclosure.

An embodiment of the present disclosure provides an array substrate. As shown in FIG. 6, the array substrate includes a plurality of parallel first power lines 10 and a plurality of parallel second power lines 20 disposed on a substrate, wherein the first power lines 10 cross the second power lines 20 to define a plurality of pixel regions; the first power lines 10 and the second power lines 20 form a plurality of intersection points 30, and the intersection points 30 include a first intersection point 31 where the first power line 10 and the second power line 20 are electrically connected with each other and a second intersection point 23 where the first power line is insulated from the second power line; the first intersection points 31 for each of the first power supply lines 10 are distributed at intervals.

Among others, the first intersection points 31 for each of the first power supply lines 10 are distributed at intervals, i.e. as shown in FIG. 6, there are the second intersection points 32 between two of the adjacent intersection points 31 along the direction in which the first power lines 10 extend.

In the embodiment as shown in FIG. 6, the first intersection points 31 for the second power lines 20 may be distributed at intervals, or there may be no the first intersection point 31; and the first intersection points may also be distributed adjacently, which is not limited by the embodiments of the present disclosure.

Herein, the principle of improving the product yield by the array substrate is similar to that of the array substrate as mentioned above and will not be repeatedly described here.

Figure 7:
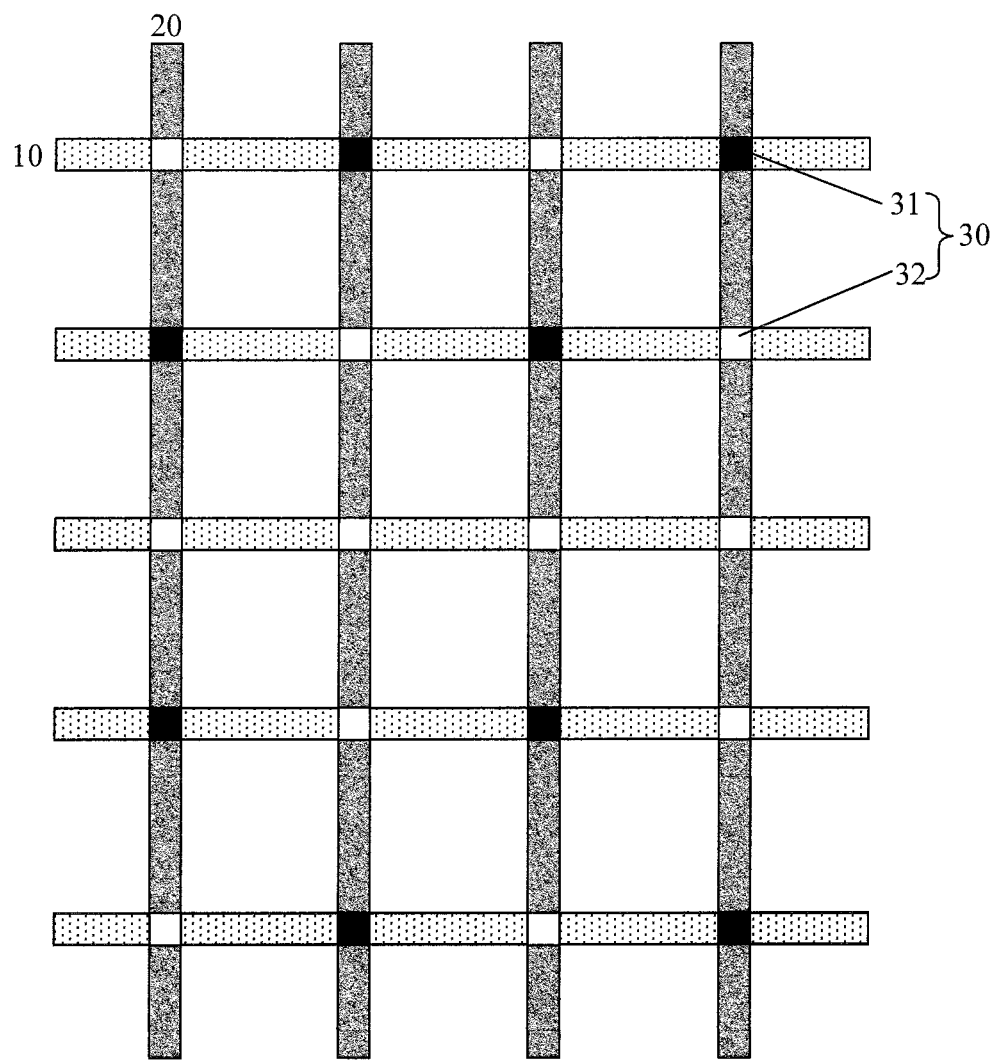
FIG. 7 is a third schematic structural diagram of a VDD line according to an embodiment of the present disclosure.

An embodiment of the present disclosure provides an array substrate. As shown in FIG. 7, the array substrate includes a plurality of parallel first power lines 10 and a plurality of parallel second power lines 20 disposed on a substrate, wherein the first power lines 10 cross the second power lines 20 to constitute a plurality of pixel regions; the first power lines 10 and the second power lines 20 form a plurality of intersection points 30, and the intersection points 30 include a first intersection point 31 where the first power line 10 and the second power line 20 are electrically connected with each other and a second intersection point 23 where the first power line is insulated from the second power line; the first intersection points 31 for each of the first power supply lines 10 are distributed at intervals and the first intersection points 31 for each of the second power supply lines 20 are distributed at intervals.

Among others, the first intersection points 31 for each of the second power supply lines 20 are distributed at intervals, i.e. as shown in FIG. 7, there are the second intersection point(s) 32 between the two adjacent intersection points 31 along the direction in which the second power lines 20 extend.

On the basis of above and as shown in FIG. 7, the first intersection points 31 for the first power lines 20 may be distributed at intervals, or there may be no the first intersection point 31; and the first intersection points may also be distributed adjacently, which is not limited by the embodiments of the present disclosure.

Herein, the principle of improving the product yield by the array substrate is similar to that of the array substrate as mentioned above and will not be repeatedly described here.

In one embodiment, as shown in FIG. 8 to FIG. 11, every the M consecutively-distributed first power lines 10 constitute a first power line unit, and every the M consecutively-distributed second power lines 20 constitute a second power line unit, and the $i^{th}$ first power line in each of the first power line units is connected with the $i^{th}$ second power line in each of the second power line units to form the first intersection point 31; wherein M is an integer greater than 1, i={1, 2, . . . , M}.

In order to avoid the resistance of the VDD line from being too great to lead to no uniformity of the signal, optionally, M≤5.

Figure 8:
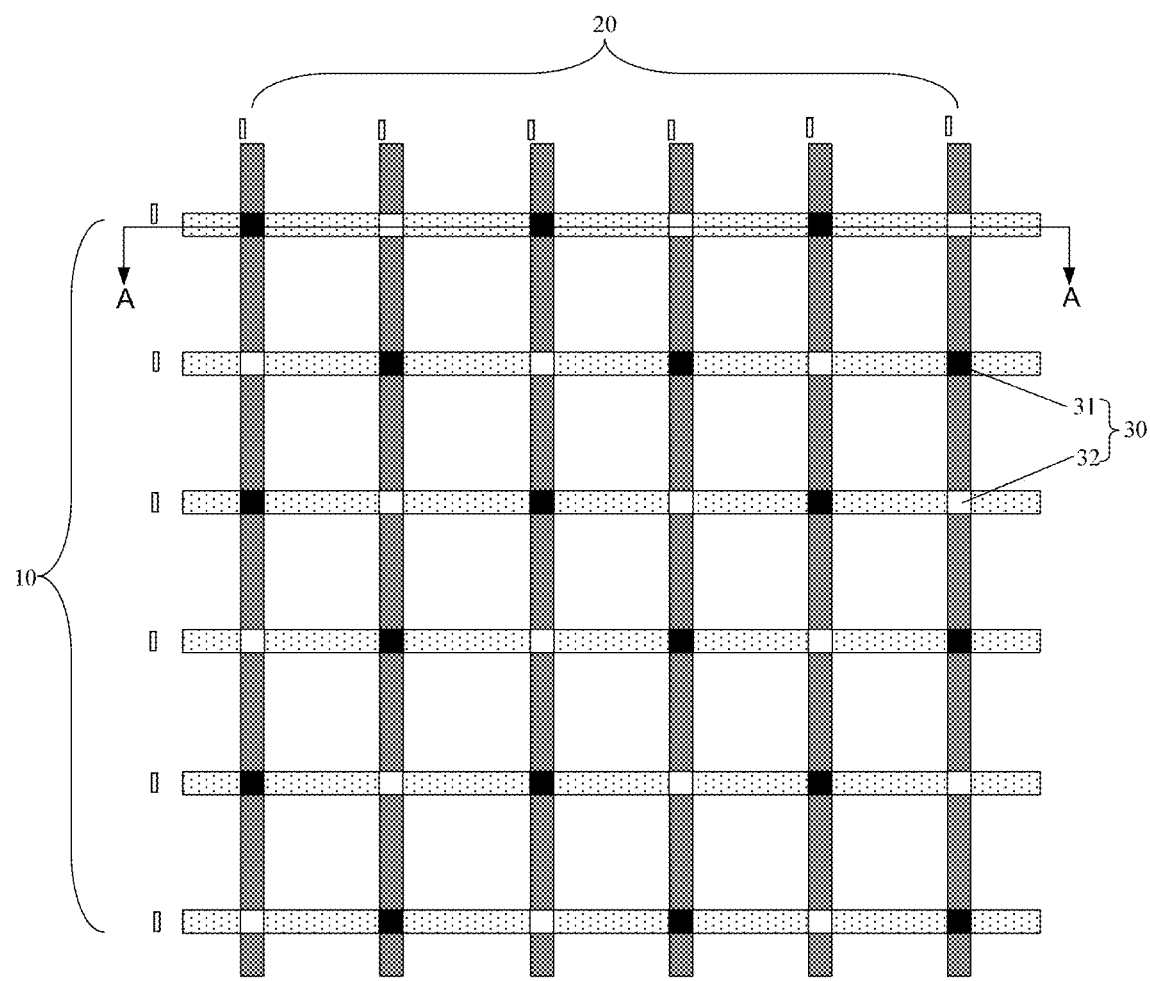
FIG. 8 is a fourth schematic structural diagram of a VDD line according to an embodiment of the present disclosure.

For example, in FIG. 8, M is equal to 2. Specifically, for the first power line 10, the ones ①and ②of the first power lines constitute one first power line unit, the ones ③ and ④ of the first power lines constitute one first power line unit, and the ones ⑤ and ⑥ of the first power lines constitute one first power line unit. Similarly, for the second power line 20, the ones ① and ② of the second power lines constitute one second power line unit, the ones ③ and ④ of the second power lines constitute one second power line unit, and the ones ⑤ and ⑥ of the second power lines constitute one second power line unit. There are two first power lines 10 in each of the first power line units, there are two second power lines 20 in each of the second power line units. The first one of the first power lines 10 is connected to the first one of the second power lines 20 to form a first intersection point 31, and the second one of the first power lines 10 is connected to the second one of the second power lines 20 to form a first intersection point 31. The first one of the first power lines 10 is connected to the second one of the second power lines 20 to form a second intersection point 32, and the second one of the first power lines 10 is connected to the first one of the second power lines 20 to form a second intersection point 32. That is to say, one of the second intersection points 32 is disposed between two adjacent one of the first intersection points 31.

This is equivalent to dividing the VDD line into two planes, in which the ones ①, ③, ⑤ of the first power lines 10 and the second power lines 20 are in one plane, and the ones ②, ④, ⑥ of the first power lines 10 and the second power lines 20 are in another plane. The distance L at the VDD line connection is twice of that in the prior art.

Figure 10:
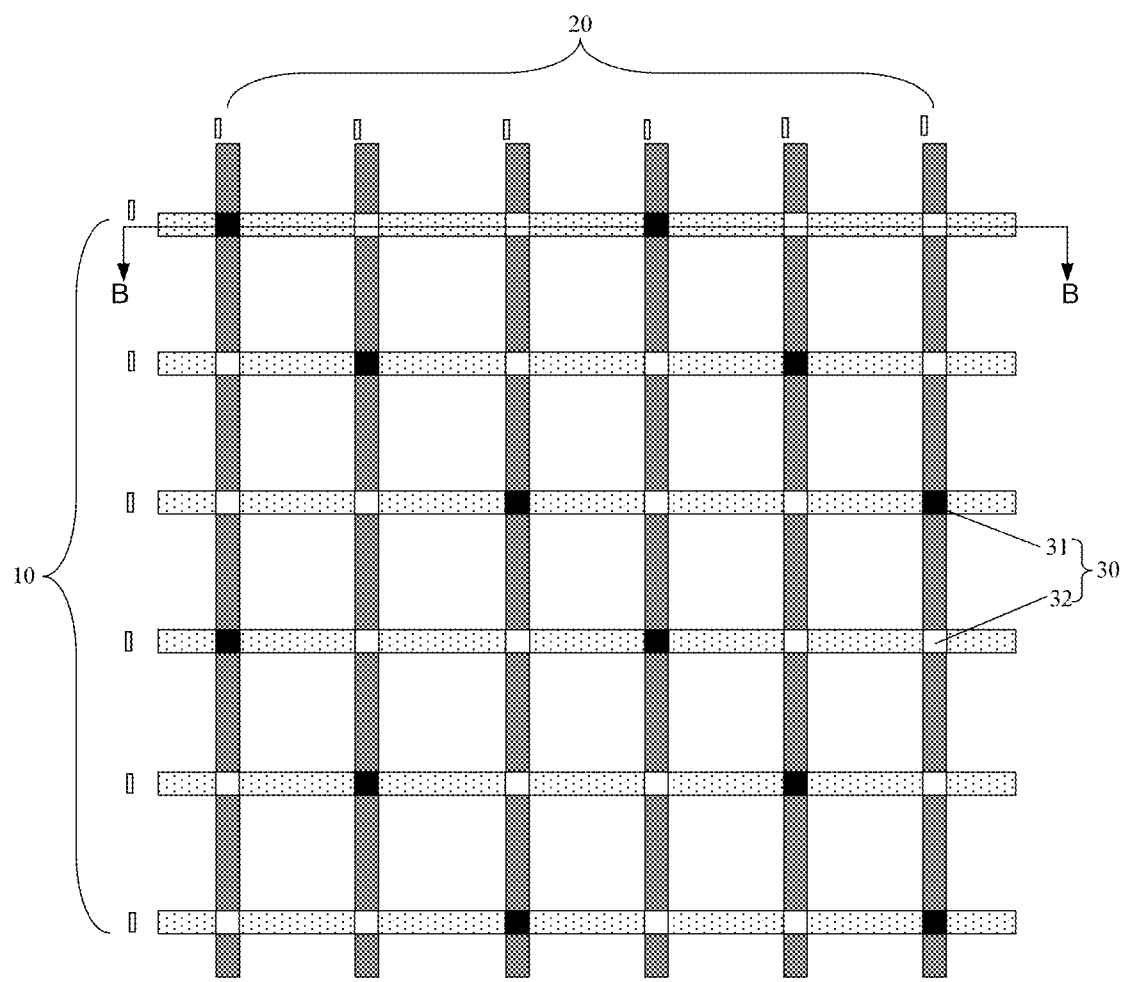
FIG. 10 is a fifth schematic structural diagram of a VDD line according to an embodiment of the present disclosure.

In FIG. 10, M is equal to 3. Specifically, for the first power line 10, the ones ①, ②, ③ of the first power lines constitute one first power line unit, the ones ④, ⑤, ⑥ of the first power line constitute one first power line unit. Similarly, for the second power line 20, the ones ①, ②, ③ of the second power lines constitute one second power line unit, the ones ④, ⑤, ⑥ of the second power lines constitute one second power line unit. There are three first power lines 10 in each of the first power line units, and there are three second power lines 20 in each of the second power line units. The first one of the first power lines 10 and the first one of the second power lines 20 are connected to form a first intersection point 31, the second one of the first power lines 10 is connected to the second one of the second power lines 20 to form a first intersection point 31, and the third one of the first power lines 10 is connected to the third one of the second power lines 20 form a first intersection point 31. The first one of the first power lines 10 are connected to the second one and the third one of the second power lines 20 respectively to form the second intersection points 32, the second one of the first power lines 10 are connected to the first one and the third one of the second power line 20 respectively to form the second intersection points 32, and the third one of the first power line 10 are connected to the first one and second one of the second power lines 20 respectively to form the second intersection points 32. That is to say, there are two of the second intersection points 32 disposed between two adjacent ones of the first intersection points 31.

This is equivalent to dividing the VDD line into three planes, in which the ones ① and ④ of the first power lines 10 and the second power lines 20 are in one plane, the ones ② and ⑤ of the first power lines 10 and the second power lines 20 are in one plane and the ones ③ and ⑥ of the first power lines 10 and the second power line 20 are in one plane. The distance L at the VDD line connection is three times of that in the prior art.

Among others, those skilled in the art should understand that i is a positive integer of 1~M. In each unit, the arrangement direction of the ones 1~i units is the same. For example, in FIG. 8, if the first and second ones in one first power line unit are assumed to be counted from left to right, the first and second ones in each of the first power line units are all counted from left to right; and if the first and second ones in one second power line unit are assumed to be counted from up to down, the first and second ones in each of the first power line units are all counted from up to down.

In the present disclosure, since the first intersection points 31 on the array substrate are uniformly and regularly arranged, it is convenient not only for fabricating the array substrate but also for detection by the AT device.

According to an embodiment of the present disclosure, the plurality of the first power lines 10 are disposed in the same layer and the plurality of the second power lines 20 are disposed in the same layer; an interlayer insulating layer is disposed between the first power lines 10 and the second power lines 20 which are connected through via holes at the first intersection points; or, an insulating pattern is disposed only at the second intersection points between the first power lines and the second power lines.

Figure 9:
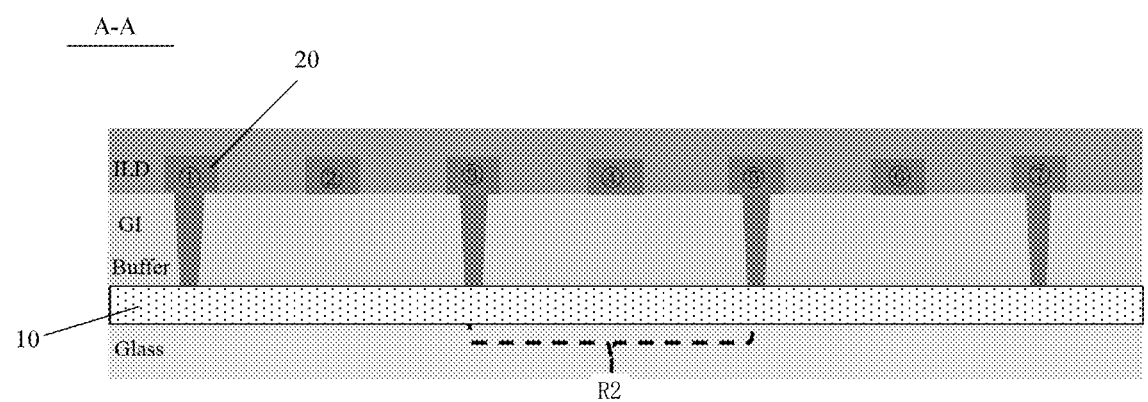
FIG. 9 is a sectional view taken along line A-A in FIG. 8.
Figure 11:
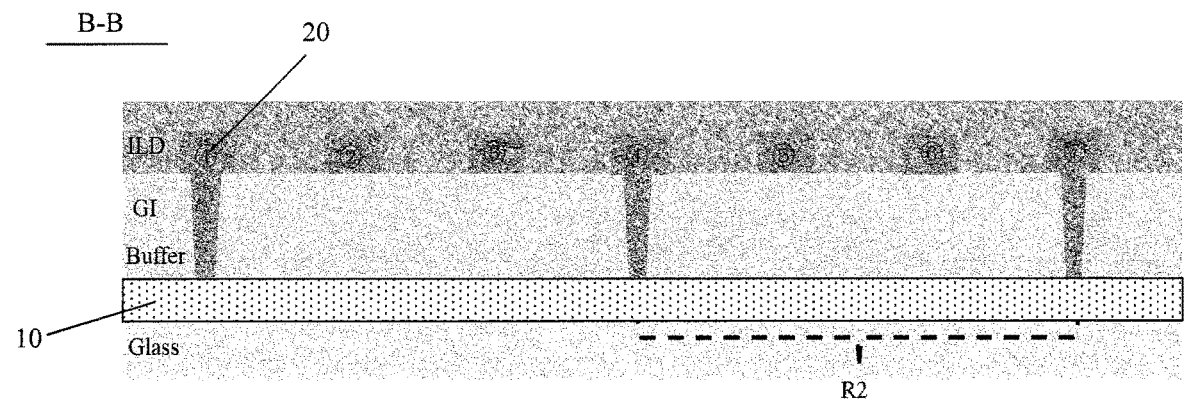
FIG. 11 is a sectional view taken along line B-B in FIG. 10.

In other words, in one embodiment and as shown in FIG. 9 and FIG. 11, the plurality of first power lines 10 are disposed in the same layer, and the plurality of second power lines 20 are disposed in the same layer; an interlayer insulating layer is disposed between the first power lines 10 and the second power lines 20 which are connected through via holes at the first intersection point.

Figure 12:
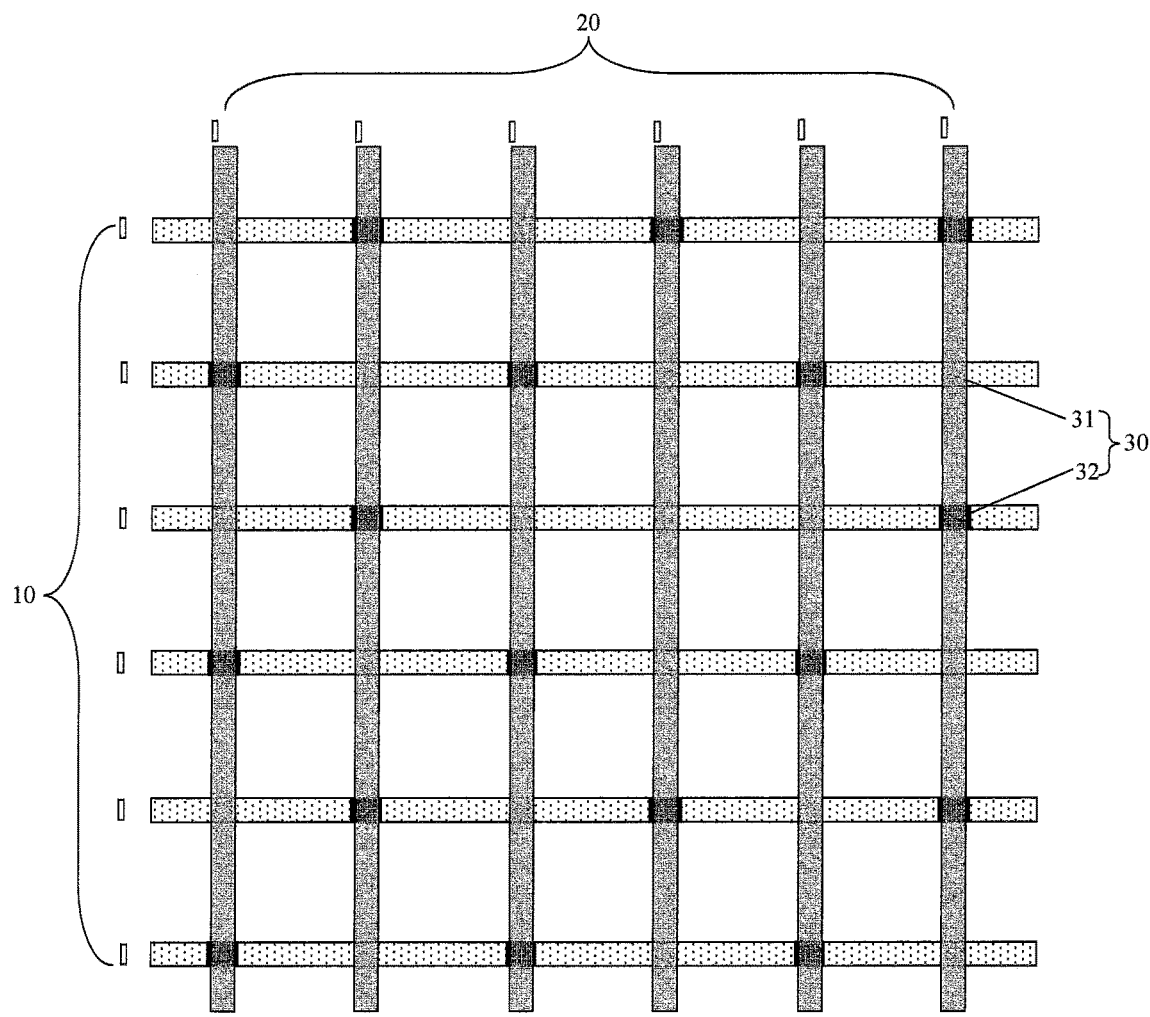
FIG. 12 is a sixth schematic structural diagram of a VDD line according to an embodiment of the present disclosure.

In another embodiment of the present disclosure, as shown in FIG. 12, the plurality of first power lines 10 are disposed in the same layer, and the plurality of second power lines 20 are disposed in the same layer; an insulating pattern is disposed only at the second intersection points 32 between the first power lines 10 and the second power lines 20. In the present embodiment, the first power lines 10 and the second power lines 20 may be located in different layers. In the present embodiment, the first power lines 10 and the second power lines 20 may be located in the same layer.

In one embodiment, the first power lines 10 and the second power lines 20 are disposed in different layers, and the first power lines 10 and the second power lines 20 are formed through different patterning processes, which may be made of the same material or different materials. For example, the first power supply lines 10 may be made of material such as molybdenum or the like with a large square resistance Rs, and the second power supply lines 20 may be made of material such as copper or the like with a small square resistance Rs. Of course, both of the first and the second power lines may be made of the same material with a large square resistance or the same material with a small square resistance.

As can be seen from the formula of $$\Delta V = I * R = I * Rs * \frac{L}{W},$$

by further increasing Rs on the basis of increasing L, the voltage drop on VDD line may be further increased to improve AT detection.

Alternatively, the square resistance of the first power line 10 is greater than the square resistance of the second power line 20.

By setting a square resistance of the first power line 10 is greater than that of the second power line 20 and increasing the voltage drop through the first power line 10, so that the signal on the VDD line flows through the second power line 20, the display effect may be guaranteed on the basis of increase of the voltage drop on the VDD line.

Alternatively, the first power lines 10 are disposed on a side of the second power lines 20 close to the substrate.

In other words, the first power lines 10 are disposed between the second power lines 20 and the substrate.

Figure 13:
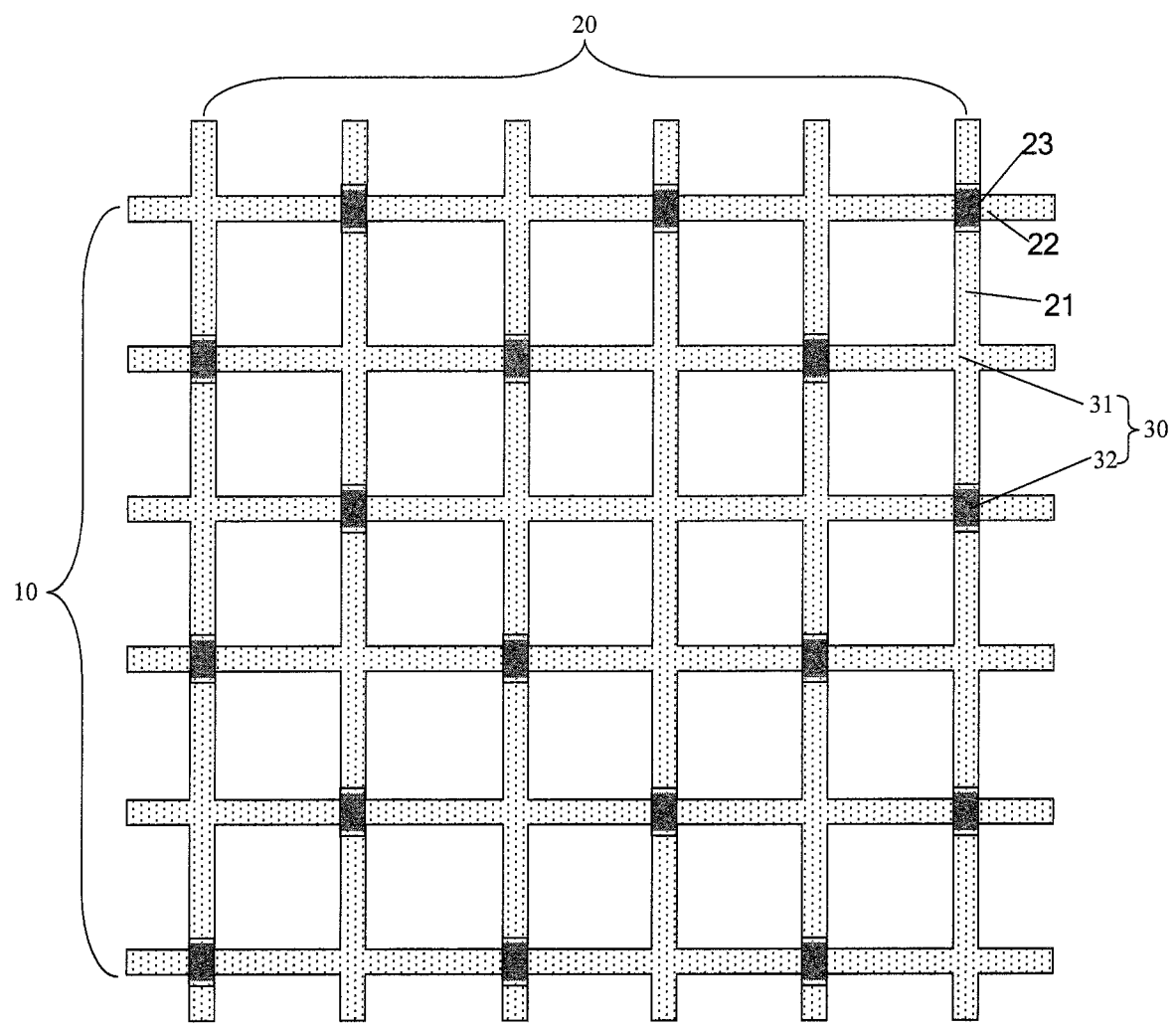
FIG. 13 is a seventh schematic structural diagram of a VDD line according to an embodiment of the present disclosure.

In the embodiment shown in FIG. 13, the plurality of the first power lines 10 are disposed in the same layer, and the second power lines 20 include a plurality of line segments 21 disposed in the same layer as the first power lines 10 and not overlapped with the first power lines 10; at the first intersection point 31, adjacent ends of two adjacent ones of the line segments 21 are connected to one of the first power lines 10; and at the second intersection point 32, two adjacent ones of the line segments 21 are connected by a bridge 22, and the bridge 22 is isolated from the first power line 10 by an insulating pattern 23.

In the present embodiment, the line segments 21 in the first power lines 10 and the second power lines 20 are disposed in the same layer and are manufactured by the same film layer. The bridge 22 and the line segments 21 may be made of the same or different. In one embodiment of the present disclosure, a square resistance of the bridge 22 is greater than that of the line segment 21.

At the first intersection point 31, the ends, adjacent to each other, of two adjacent line segments 21 are connected to a first power line 10. That is to say, an end of a line segment 21 is directly connected to a first power line 10 and does not run across the first power line 10. A first power line 10 and a second power line 20 share the structure at a position where a first intersection point 31 is located.

The structure of the VDD line provided in this embodiment not only facilitates the manufacturing of the VDD line, but also enables the array substrate to be light and thin.

In order to enable the array substrate to be light and thin and simplify the manufacturing process, in an embodiment of the present disclosure, the array substrate further includes a gate line disposed in the same layer as the second power lines 20.

That is to say, when the first power lines 10 and the second power lines 20 are disposed in different layers, the second power lines 10 may be disposed in the same layer as the metal layer on the array substrate. For example, it may be provided in the same layer as a gate line.

An embodiment of the present disclosure also provides a display device including the array substrate as mentioned above and an anode disposed on the array substrate.

The display device herein may only include an array substrate and a counter substrate for assembling a cell, and may also include a frame or the like.

The display device as mentioned above may specifically be a product or component having any display function such as an organic electroluminescent diode display, a liquid crystal display, a liquid crystal television, a digital photo frame, a mobile phone, a tablet computer, a navigator, and the like.

The display device provided by the embodiment of the present disclosure includes the above array substrate, and the beneficial effects thereof are the same as those of the array substrate, and will not be repeated here.

An embodiment of the present disclosure also provides a method of detecting the display device as mentioned above, wherein the method includes a step of: using a detector to detect a potential across the anode of the display device, and determining a region where a failure occurs by determining whether the potential across the anode is changed.

Specifically, the step as mentioned above includes: sensing the potential on the anode by electrodes in the detector; and determining that a failure occurs in the pixel where the anode is located if liquid crystal in the detector is rotated so that the detector emits light.

That is to say, the potential on the anode changes, and after sensing the potential on the anode, the potential on the electrode of the detector changes, thereby generating a potential difference to deflect the liquid crystal and causing the detector to emit a light. If the detector emits a light, it indicates that a failure occurs in the pixel where the anode is currently being detected.

The method further includes determining a position where the failure occurs by an optical detection.

Specifically, a pixel structure of the normal pixel is captured by a microscope as a reference pixel structure; a pixel structure of a pixel where a failure occurs is captured and compared with the reference pixel structure to determine a position where the failure occurs.

By comparing the differences between the pixel structures of the two pixels, the location where the failure occurs may be determined. In a normal circumstance, there will be black spots or other features at the place where the short circuit occurs, which can be found through comparison.

It should be noted that the potential difference on the anode is generated by the voltage drop across a first power line 10 or a second power line 20. The greater the voltage drop is, the greater the potential difference on the anode is, and so the detector can detect the region where the failure occurs. The reason for the lower yield rate in the prior art is in that the voltage drop on the power line is too small, to detect the region where the failure occurs. The present disclosure increases product yield by increasing the voltage drop.

By detecting the above-mentioned array substrate by the detection method provided in the embodiment of the present disclosure, according to the above formula for calculating the voltage drop, it may be known that the distance between two adjacent first intersection points on the array substrate provided by the present disclosure is greater than that between two first intersection points in the prior art, so that the voltage drop at the position where the failure occurs is increased and may be easily detected. Thus, defects on the array substrate may be accurately and completely detected and the product yield may be improved.

The foregoing descriptions are merely specific implementation manners of the present disclosure, but the scope of the present disclosure is not limited thereto. It is appreciated for those skilled in the art about any change or modification within the technical scope disclosed by the present disclosure, which all fall within the scope of the disclosure. Therefore, the scope of the present disclosure should be defined based on the scope of the claims.

We claim:

1. An array substrate comprising a plurality of first power lines parallel to one another and a plurality of second power lines parallel to one another, which are both disposed on a substrate, wherein the first power lines cross the second power lines to define a plurality of pixel regions, wherein the first power lines and the second power lines cross one another at a plurality of intersection points, and the plurality of intersection points comprise a first intersection point where one of the first power lines is electrically connected to one of the second power lines and a second intersection point where the first power line is insulated from the second power line;

the first intersection points are distributed at intervals such that any two adjacent ones of the first intersection points are separated by at least one of the second intersection points along each of the first power lines and/or along each of the second power lines;

the first power lines and the second power lines are configured to transmit a same signal, wherein the plurality of first power lines are disposed in the same layer and the plurality of the second power lines are disposed in the same layer;

an insulating pattern is disposed only at the second intersection points between the first power lines and the second power lines; and at anywhere other than the second intersection point where the first power line is insulated from the second power line, the first power-line and the second power line are disposed in a same layer.

2. The array substrate according to claim 1, wherein every M consecutive ones of the first power lines constitute a first power line unit, and every M consecutive ones of the second power lines constitute a second power line unit, and an $i^{th}$ one of the first power lines in each of the first power line units is connected with an $i^{th}$ one of the second power lines in each of the second power line units to form one of the first intersection points;

wherein M is an integer greater than 1, i={1, 2, ..., M}.

3. The array substrate according to claim 1, wherein a square resistance of the first power line is greater than that of the second power line.

4. The array substrate according to claim 3, wherein the first power lines are disposed on a side of the second power lines close to the substrate.

5. The array substrate according to claim 1, further comprising a gate line disposed in the same layer as the second power lines.

6. The array substrate according to claim 1, wherein the plurality of first power lines are disposed in the same layer, and the second power lines comprise a plurality of line segments disposed in the same layer as the first power lines and not overlapped with the first power lines;

at each of the first intersection points, adjacent ends of two adjacent ones of the line segments are connected to the first power line;

at the second intersection point, two adjacent ones of the line segments are connected by a bridge, and the bridge is isolated from the first power lines by an insulating pattern.

7. The array substrate according to claim 6, wherein a square resistance of the bridge is larger than that of the line segment.

8. The array substrate according to claim 6, wherein ends of the line segments are directly connected to the first power lines respectively and the line segments do not run across the first power lines, and the first power lines and the second powers line share structures at positions where the first intersection points are located.

9. The array substrate according to claim 1, wherein M≤5.

10. The array substrate of claim 9, wherein M=2 or M=3.

11. The array substrate according to claim 1, wherein the first power lines are perpendicular to the second power lines.

12. The array substrate according to claim 1, wherein no insulating layer is provided between the first power lines and the second power lines at the first intersection points such that they are in contact with and thus in electrical connection with each other directly.

13. A display device comprising the array substrate according to claim 1 and an anode disposed on the array substrate.

14. A method for detecting the display device according to claim 13, the method comprising steps of:

using a detector to detect a potential across the anode of the display device, and determining a region where a failure occurs by judging whether or not the potential across the anode is changed; and determining a position where the failure occurs by an optical detection.

15. The method according to claim 14, wherein the step of using a detector to detect a potential across the anode of the display device and determining a region where a failure occurs by judging whether or not the potential across the anode is changed comprises:

sensing the potential across the anode by electrodes in the detector; and determining that a failure occurs in a pixel where the anode is located if liquid crystal in the detector is rotated so that the detector emits light.

16. The method according to claim 14, wherein the step of determining a position where the failure occurs by an optical detection comprises:

capturing a pixel structure of a normal pixel by a microscope as a reference pixel structure; and capturing a pixel structure of a pixel where a failure occurs and comparing it with the reference pixel structure to determine a position where the failure occurs.

17. The method according to claim 14, wherein before using the detector to detect, a same voltage is applied to the first power lines parallel to one another and the second power lines parallel to one another respectively.

* * * * *